US010158949B2

United States Patent
Sun et al.

(10) Patent No.: US 10,158,949 B2
(45) Date of Patent: Dec. 18, 2018

(54) MEMS MICROPHONE AND METHOD OF MANUFACTURING THE SAME

(71) Applicant: DONGBU HITEK CO., LTD, Seoul (KR)

(72) Inventors: Jong Won Sun, Gyeonggi-do (KR); Joo Hyeon Lee, Gyeonggi-do (KR); Han Choon Lee, Seoul (KR)

(73) Assignee: DB HITEK CO., LTD., Seoul (KR)

( * ) Notice: Subject to any disclaimer, the term of this patent is extended or adjusted under 35 U.S.C. 154(b) by 0 days.

(21) Appl. No.: 15/497,358

(22) Filed: Apr. 26, 2017

(65) Prior Publication Data
US 2017/0311083 A1    Oct. 26, 2017

(30) Foreign Application Priority Data
Apr. 26, 2016 (KR) .......................... 10-2016-0050897

(51) Int. Cl.
*H04R 7/18* (2006.01)
*H04R 19/04* (2006.01)
(Continued)

(52) U.S. Cl.
CPC .............. *H04R 7/18* (2013.01); *B81B 3/0021* (2013.01); *B81C 1/00158* (2013.01);
(Continued)

(58) Field of Classification Search
CPC ...... H04R 19/005; H04R 19/04; H04R 31/00; H04R 7/24; H04R 2307/204; B81B 3/0072
(Continued)

(56) References Cited

U.S. PATENT DOCUMENTS

| 8,942,394 B2 * | 1/2015 | Conti ....................... H04R 7/24 381/174 |
| 2006/0233401 A1 * | 10/2006 | Wang .................... B81B 3/0072 381/176 |
| 2016/0362292 A1 * | 12/2016 | Chang .................. H04R 19/005 |

FOREIGN PATENT DOCUMENTS

| KR | 10-2010-0073051 | 7/2010 |
| KR | 10-1462375 | 11/2014 |
| KR | 10-1578542 | 12/2015 |

OTHER PUBLICATIONS

Application and File History for U.S. Appl. No. 15/497,374, filed Apr. 26, 2017. Inventors: Sun et al.
(Continued)

*Primary Examiner* — Sunita Joshi
(74) *Attorney, Agent, or Firm* — Patterson Thuente Pedersen, P.A.

(57) ABSTRACT

A MEMS microphone includes a substrate having a cavity, a back plate disposed over the substrate, a diaphragm being disposed between the substrate and the back plate and being spaced apart from the substrate and the back plate and at least one anti-buckling portion provided between the substrate and the diaphragm. The diaphragm covers the cavity and the diaphragm senses an acoustic pressure to create a displacement. The anti-buckling portion is configured to temporarily support the diaphragm in case of a warpage of the diaphragm to prevent a buckling of the diaphragm. Thus, the MEMS microphone can prevent the diaphragm from generating a warpage by more than a predetermined degree, so that the diaphragm can have a tensile stress and the buckling phenomenon of the diaphragm can be prevented.

20 Claims, 5 Drawing Sheets

(51) Int. Cl.
*H04R 31/00* (2006.01)
*B81B 3/00* (2006.01)
*B81C 1/00* (2006.01)

(52) U.S. Cl.
CPC ........... *H04R 19/04* (2013.01); *H04R 31/003* (2013.01); *B81B 2201/0257* (2013.01); *B81B 2203/0127* (2013.01); *B81B 2203/0307* (2013.01); *B81C 2201/017* (2013.01); *H04R 2201/003* (2013.01); *H04R 2307/204* (2013.01)

(58) Field of Classification Search
USPC ............... 381/175, 174, 181, 190, 191, 178; 367/170, 178, 163, 174
See application file for complete search history.

(56) References Cited

OTHER PUBLICATIONS

Application and File History for U.S. Appl. No. 15/497,366, filed Apr. 26, 2017. Inventors: Sun et al.
Application and Filing Receipt for U.S. Appl. No. 15/414,104, filed Jan. 24, 2017. Inventors: Lee et al.
Application and Filing Receipt for U.S. Appl. No. 15/414,125, filed Jan. 24, 2017. Inventors: Lee et al.
Korean Office Action, Korean Application No. 10-2016-0050894, dated Feb. 22, 2018, 3 pages (7 pages with translation).
Korean Final Office Action, Korean Application No. 10-2016-0050894, dated Jun. 26, 2018, 4 pages (7 pages with translation).

* cited by examiner

MEMS MICROPHONE AND METHOD OF MANUFACTURING THE SAME

CROSS-REFERENCE TO RELATED APPLICATION

This application claims priority to Korean Patent Application No. 10-2016-0050897, filed on Apr. 26, 2016 and all the benefits accruing therefrom under 35 U.S.C. § 119, the contents of which are incorporated by reference in their entirety.

TECHNICAL FIELD

The present disclosure relates to MEMS microphones capable of converting a sound wave into an electrical signal, and a method of manufacturing such MEMS microphones. More particularly, embodiments described herein relate to capacitive MEMS microphones capable of detecting an acoustic pressure to create a displacement and output an acoustic signal.

BACKGROUND

Generally, a capacitive microphone utilizes a capacitance between a pair of electrodes facing each other to transmit an acoustic signal. The capacitive microphone can be manufactured by a semiconductor MEMS process to have an ultra-small size.

A MEMS microphone includes a bendable diaphragm and a back plate facing the diaphragm. The diaphragm is disposed apart from a substrate and the back plate to freely bend upward or downward in response to sound waves incident upon the diaphragm. The diaphragm can be a membrane structure to sense an acoustic pressure to create a displacement. In other words, when the acoustic pressure arrives at the diaphragm, the diaphragm may be bent toward the back plate due to the acoustic pressure. The displacement of the diaphragm can be sensed through a change of capacitance formed between the diaphragm and the back plate. As a result, sound can be converted into an electrical signal for output.

A device characteristic in the MEMS microphone can be identified through a value of capacitance using a C-V measurement. In other words, when a voltage is applied to the diaphragm, the diaphragm having a semi-spherical shape can be bent toward the back plate to generate a capacitance. Contrariwise, when the voltage being applied to the diaphragm is off, the diaphragm can return to an initial position such that the value of capacitance between the diaphragm and the back plate becomes zero.

However, even though the applied voltage is off, the diaphragm cannot return to the initial position to stay bent. Thus, a buckling phenomenon may occur such that there is no change in the value of the capacitance.

The buckling phenomenon may occur due to a stress of the diaphragm. That is, the diaphragm can have an ideal stress in case when the diaphragm is kept horizontally or is bent by under 0.5 μm. However, when the diaphragm is bent by over 0.5 μm, the diaphragm may have a compressive stress to cause the buckling phenomenon occur such that the MEMS microphone may malfunction.

SUMMARY

The example embodiments of the present invention provides a MEMS microphone by completely removing an insulation layer disposed under the diaphragm to prevent the buckling phenomenon from occurring and a method of manufacturing a MEMS microphone.

According to an example embodiment of the present invention, a MEMS microphone includes a substrate having a cavity, a back plate disposed over the substrate and having a plurality of acoustic holes, a diaphragm disposed between the substrate and the back plate, the diaphragm being spaced apart from the substrate and the back plate and covering the cavity, the diaphragm sensing an acoustic pressure to create a displacement and at least one anti-buckling portion provided between the substrate and the diaphragm to temporarily support the diaphragm in case of a warp of the diaphragm to prevent a buckling of the diaphragm.

According to an example embodiment, the MEMS microphone may further include an anchor provided at an end portion of the diaphragm and connected to the substrate to support the diaphragm, and the anti-buckling portion may be located along a radial direction between a region where the anchor is located and a region where the cavity is formed.

In an example embodiment, the anti-buckling portion may include a plurality of anti-buckling pads stacked vertically.

In an example embodiment, the anti-buckling pads may comprise a first anti-buckling pad formed on an upper face of the substrate and a second anti-buckling pad disposed over the first anti-buckling pad and on a lower face of the diaphragm.

In an example embodiment, the first and the second anti-buckling pads may be spaced apart from each other.

In an example embodiment, the anti-buckling pads may further include a third anti-buckling pad disposed over the second anti-buckling pad and on an upper face of the diaphragm.

In an example embodiment, the anti-buckling portion may be formed in plural and anti-buckling portion are spaced apart from one another along a circumference of the cavity.

In an example embodiment, the anti-buckling portion may have a cylindrical shape.

In an example embodiment, the anti-buckling portion may be disposed adjacent to the cavity.

In an example embodiment, the anti-buckling portion may include silicon nitride.

In an example embodiment, the anti-buckling portion may have a thickness adjustable in accordance with a flat degree or a warpage degree of the diaphragm.

According to an example embodiment of the present invention, a MEMS microphone includes a substrate having a cavity, the substrate being divided into a vibration area and a peripheral area surrounding the vibration area, a diaphragm disposed over the substrate to cover the cavity, the diaphragm being spaced apart from the substrate, and sensing an acoustic pressure to create a displacement, a back plate disposed over the diaphragm, the back plate being spaced apart from the diaphragm to face the diaphragm and having a plurality of acoustic holes and a plurality of anti-buckling pads between which the diaphragm is located, to face each other, and the anti-buckling pads being disposed in the peripheral area and being configured to prevent buckling of the diaphragm.

According to an example embodiment of the present invention, a MEMS microphone may further include an anchor disposed in the peripheral area to be connected to the diaphragm, the anchor connecting the diaphragm to the substrate, wherein the anti-buckling portion is located closer to the cavity than the anchor.

In an example embodiment, the anti-buckling portion may be formed in a plural and anti-buckling portions are spaced apart from one another along a circumference of the cavity to surround the vibration area.

In an example embodiment, the anti-buckling pads may include a first anti-buckling pad formed on an upper face of the substrate, a second anti-buckling pad disposed over the first anti-buckling pad and on a lower face of the diaphragm and a third anti-buckling pad disposed over the second anti-buckling pad and on an upper face of the diaphragm.

According to an example embodiment of the present invention, a MEMS microphone a MEMS microphone is formed by forming an anti-buckling portion in a peripheral region of a substrate, the substrate being divided into a vibration area and the peripheral area surrounding the vibration area, forming an insulation layer on the substrate on which the anti-buckling portion is formed, forming a diaphragm and an anchor on the insulation layer, the anchor being connected to the diaphragm to support the diaphragm and being formed in the peripheral area, and the diaphragm being prevented from a warpage owing to the anti-buckling portion, forming a sacrificial layer on the insulation layer on which the diaphragm is formed, forming a back plate on the sacrificial layer and in the vibration area to face the diaphragm, patterning the substrate to form a cavity in the vibration area to expose the insulation layer, removing a portion of the insulation layer under the diaphragm through an etching process using the cavity as an etch mask and removing a portion of the sacrificial layer, corresponding to the diaphragm and the anchor.

In an example embodiment, forming the anti-buckling portion may include forming a plurality of anti-buckling pads having a vertically-stacked structure.

In an example embodiment, forming the anti-buckling portion may include forming a first anti-buckling pad on an upper face of the substrate and prior to forming the diaphragm, forming a second anti-buckling pad on an upper face of the insulation layer to be opposite to the fist anti-buckling pad.

In an example embodiment, forming the anti-buckling portion may further include forming a third anti-buckling pad on an upper face of the diaphragm to correspond to the second anti-buckling pad, after forming the diaphragm.

In an example embodiment, the anti-buckling portion is formed in plural and anti-buckling portions are spaced apart from one another along a circumference of the vibration area.

According to example embodiments, the semiconductor gas sensor includes an exposure hole to relieve sag of a membrane toward a cavity. Further, the semiconductor gas may include a plurality of protrusion portions to support a second insulation layer formed beneath a lower face of the second insulation layer to alleviate sag of the membrane.

According to example embodiments of the present invention as described above, the MEMS microphone includes the anti-buckling portion capable of supporting the diaphragm at the end portion side of the diaphragm, thereby preventing the diaphragm from generating a warpage by more than a predetermined degree. Accordingly, the diaphragm can have a tensile stress rather than a compressive stress, so that the buckling phenomenon of the diaphragm can be prevented and the yield of the product can be improved. Further, the anti-buckling portion has the first and second anti-buckling pads disposed under the diaphragm and the third anti-buckling pad on the upper surface of the diaphragm, thereby facilitating a return of the diaphragm to the initial position as well as preventing the defective deflection of the diaphragm.

The above summary is not intended to describe each illustrated embodiment or every implementation of the subject matter hereof. The figures and the detailed description that follow more particularly exemplify various embodiments.

BRIEF DESCRIPTION OF THE DRAWINGS

Exemplary embodiments can be understood in more detail from the following description taken in conjunction with the accompanying drawings, in which.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION OF EMBODIMENTS

Hereinafter, specific embodiments will be described in more detail with reference to the accompanying drawings. The present invention may, however, be embodied in different forms and should not be construed as limited to the embodiments set forth herein.

As an explicit definition used in this application, when a layer, a film, a region, or a plate is referred to as being 'on' another one, it can be directly on the other one, or one or more intervening layers, films, regions, or plates may also be present. By contrast, it will also be understood that when a layer, a film, a region, or a plate is referred to as being 'directly on' another one, it is directly on the other one, and one or more intervening layers, films, regions, or plates do not exist. Also, although terms such as a first, a second, and a third are used to describe various components, compositions, regions, and layers in various embodiments of the present invention are not limited to these terms.

Furthermore, and solely for convenience of description, elements may be referred to as "above" or "below" one another. It will be understood that such description refers to the orientation shown in the Figure being described, and that in various uses and alternative embodiments these elements could be rotated or transposed in alternative arrangements and configurations.

In the following description, the technical terms are used only for explaining specific embodiments while not limiting the scope of the present invention. Unless otherwise defined herein, all the terms used herein, which include technical or scientific terms, may have the same meaning that is generally understood by those skilled in the art.

The depicted embodiments are described with reference to schematic diagrams of some embodiments of the present invention. Accordingly, changes in the shapes of the diagrams, for example, changes in manufacturing techniques and/or allowable errors, are sufficiently expected. The Figures are not necessarily drawn to scale. Accordingly, embodiments of the present invention are not described as being limited to specific shapes of areas described with diagrams and include deviations in the shapes and also the areas described with drawings are entirely schematic and their shapes do not represent accurate shapes and also do not limit the scope of the present invention.

Figure 1:
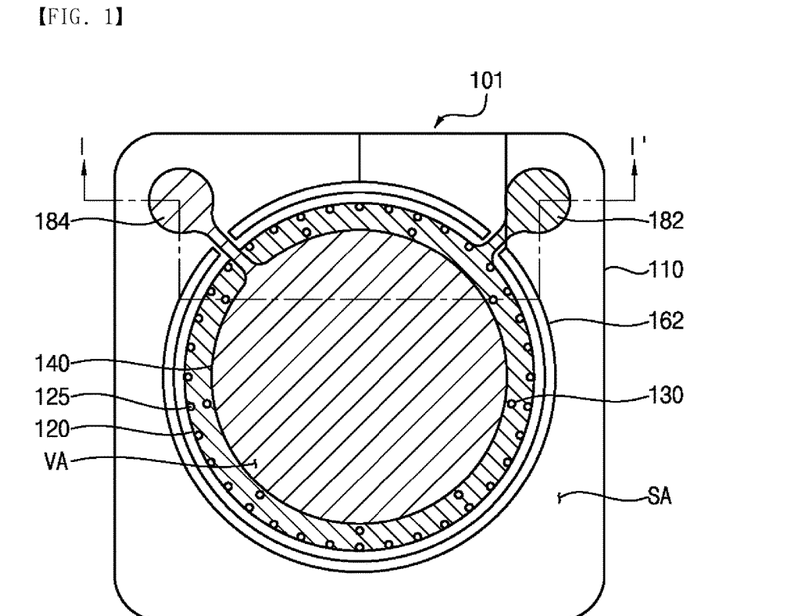
FIG. 1 is a plan view illustrating a MEMS microphone in accordance with an example embodiment of the present invention.
Figure 2:
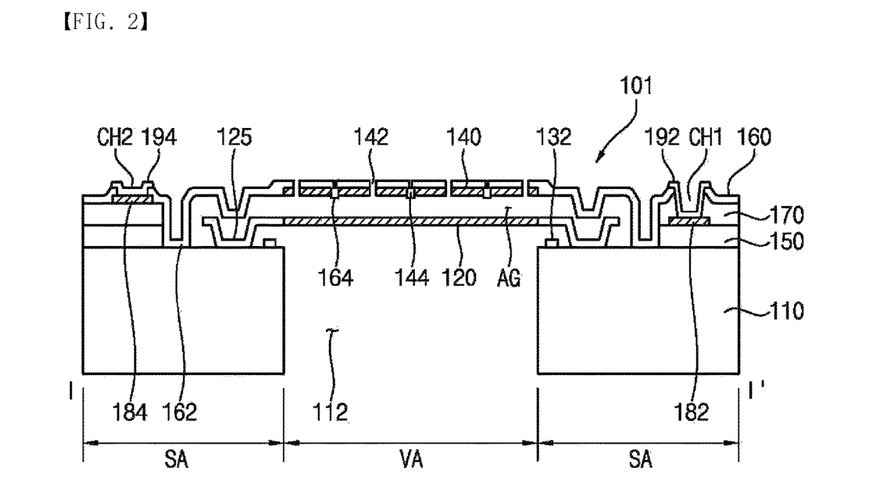
FIG. 2 is a cross sectional view taken along a line I-I' as depicted in FIG. 1.

FIG. 1 is a plan view illustrating a MEMS microphone in accordance with an example embodiment of the present invention. FIG. 2 is a cross sectional view taken along a line I-I' in FIG. 1.

Referring to FIGS. 1 and 2, a MEMS microphone in accordance with an example embodiment of the present invention is capable of generating a displacement according to an acoustic pressure to convert sound into an electrical signal and transmit the electrical signal. The MEMS microphone includes a substrate 110, a diaphragm 120, an anti-buckling portion 130 and a back plate 140

In particular, the substrate 110 is defined to be divided into a vibration area VA and a peripheral area SA. In the vibration area VA, a cavity 112 is formed.

In an example embodiment, the vibration area VA may have a cross-sectional area corresponding to that of the cavity 112.

The diaphragm 120 may be formed to have a membrane structure. The diaphragm 120 may cover the cavity 112 over the substrate 110 to be exposed through the cavity 112. The diaphragm 120 is bendable by responding to the acoustic pressure and is apart from the substrate. The diaphragm may have an ion implantation region into which impurities are doped, at a position corresponding to at least the vibration area VA.

In an example embodiment, the diaphragm may have a shape of a disc plate, and the cavity may have a cylindrical shape.

The diaphragm 120 includes at least one anchor 125 formed at an end portion thereof. The anchor 125 may support a main portion of the diaphragm 120 such that the main portion of the diaphragm 120 is apart from the substrate 110. The anchor 125 is positioned in the peripheral portion SA of the substrate 110. The anchor may have a lower face to make contact with an upper face of the substrate 110. A plurality of the anchor 125 may be formed. For example, as shown in FIG. 1, each of the anchors 125 is positioned along a circumference of the diaphragm 120 to be apart from one another.

In an example embodiment, the anchor 125 may have a cylindrical shape and thus, "U" shape in a longitudinal sectional view, as depicted in FIG. 2.

The anti-buckling portion 130 is disposed under a lower face of the diaphragm 120. A plurality of the anti-buckling portion 130 may be formed on the substrate 110. Each of the anti-buckling portions 130 may include a first anti-buckling pad 132. The first anti-buckling pad 132 is disposed between the substrate 110 and the diaphragm 120 along a vertical direction. Further, the first anti-buckling pad 132 is disposed on the substrate 110 between the anchor 125 and the cavity 112 along a radial direction. The first anti-buckling pad 132 may support the diaphragm 120 in order to protect the diaphragm 120 from occurring.

In detail, when the diaphragm 120 is bent downwardly, the first anti-buckling pad 132 may support an end portion of the diaphragm 120 to protect the diaphragm 120 from being bent by more than a predetermined value, for example, about 0.5 µm. Therefore, when the diaphragm 120 has a tensile stress, not a compressive stress, the first diaphragm pad 132 may prevent the buckling phenomenon of the diaphragm 120.

In an example embodiment, the anti-buckling portion 130 may be positioned along a circumference of the cavity 112 and in the vibration area VA to be apart from one another. The first anti-buckling pad 132 may have a dot shape. Further, the first anti-buckling pad 132 may have a thickness to be adjusted considering a flatness degree or a warpage degree of the diaphragm 120.

The back plate 140 is disposed over the diaphragm 120. The back plate 140 is positioned in the vibration area VA. Further, the back plate 140 may face the diaphragm 120. As shown in FIG. 1, the back plate 140 may have a disc shape. The back plate 140 may have an ion implantation region in which impurities are doped similar to the diaphragm 120.

The back plate 140 is spaced apart from the diaphragm 120 such that it is capable of being freely bent, as shown in FIG. 2, such that an air gap AG is formed between the diaphragm 120 and the back plate 140. In embodiments, a sacrificial layer is formed between the diaphragm 120 and the back plate 140, and the sacrificial layer is subsequently removed, such that the air gap AG is formed in place of that sacrificial layer to space the diaphragm 120 apart from the back plate 140.

In an example embodiment, the MEMS microphone 101 may further include a first insulation layer 150, a second insulation layer 160, an insulating interlayer 170, a diaphragm pad 182, a back plate pad 184, a first pad electrode 192 and a second pad electrode 194.

In particular, the first insulation layer 150 is formed on the upper face of the substrate 110 and is positioned in the peripheral area SA.

The second insulation layer 160 may be disposed over the substrate 110 having the back plate 140 and the first insulation layer 150 to cover the upper face of the back plate 140. The second insulation layer 160 may extend outwardly from the back plate 140 to define a chamber portion 162. The chamber portion 162 may be located on or in the peripheral region SA.

The chamber portion 162 may be spaced apart from the anchor 125, as shown in FIG. 1, and may be formed as a ring or other circumscribing arrangement to surround the anchor 125. The second insulation layer 160 is spaced apart from both the diaphragm 120 and the anchor 125 and the air gap AG is formed between the diaphragm 120 and the anchor 125. As shown in FIG. 2, the chamber portion 162 makes contact with the upper face of the substrate 110 to support the back plate 140 which is coupled to the lower face of the second insulation layer 160. As a result, the back plate 140 may be kept apart from the diaphragm 120.

The back plate 140 and the second insulation layer 160 may include a plurality of acoustic holes 142 through which sound waves pass. The acoustic holes 142 are formed through the back plate 140 and the second insulation layer 160. Thus, the acoustic holes may communicate with the air gap AG.

The back plate 140 may have a plurality of dimple holes 144 and the second insulation layer 160 may have a plurality of dimples 164 corresponding to the dimple holes 144. The dimple holes 144 are formed through the back plate 140, and the dimples 164 are provided at a position where the dimple holes 144 are formed and can extend through and beyond the bottom face of back plate 140.

The dimples 164 may prevent the diaphragm 120 from adhering to the bottom surface of the back plate 140. That is, when sound reaches to the diaphragm 120, the diaphragm 120 may be bent in a semicircular shape toward the back plate 140, and then return to its initial position. The degree of bending of the diaphragm 120 may vary depending on the strength of the sound. The upper face of the diaphragm 120 may be bent to contact the lower surface of the back plate 140. When the diaphragm 120 is bent so much as to make contact with the back plate 140, the diaphragm 120 may not return from the back plate 140 to the initial position. However, if the dimples 164 protrude from the lower face of the back plate 140 until they touch the diaphragm 120, the dimples 164 may space the diaphragm 120 apart from and the back plate 140 such that the diaphragm 120 returns to the initial position, even though the diaphragm 120 is severely bent to make the diaphragm 120 contact the back plate 140.

The diaphragm pad 182 may be formed on the upper face of the first insulation layer 150. The diaphragm pad 182 may be connected to the diaphragm 120 and may be located in the peripheral region SA.

The insulating interlayer 170 may be formed on the first insulation layer 150 having the diaphragm pad 182. The insulating interlayer 170 is disposed between the first insulation layer 150 and the second insulation layer 160 and is located in the peripheral region SA. Here, the first insulation layer 150 and the insulating interlayer 170 may be located outside the chamber portion 162, as shown in FIG. 2. The insulating interlayer 170 may be formed using silicon oxide in some embodiments.

The back plate pad 184 may be formed on the upper face of the insulating interlayer 170. The back plate pad 184 is connected to the back plate 140 and may be located in or on the peripheral region SA.

The diaphragm pad 182 may be exposed through a first contact hole CH1 formed by partially removing the second insulation layer 160 and the insulating interlayer 170. On the other hand, the back plate pad 184 may be exposed through a second contact hole CH2 formed by partially removing the second insulation layer 160.

The first and second pad electrodes 192 and 194 may be formed on the second insulation layer 160. The first pad electrode 192 is located on the upper side of the diaphragm pad 182 and makes contact with the diaphragm pad 182 through the first contact hole CH1. The second pad electrode 194 is positioned on the back plate pad 184 and makes contact with the back plate pad 184 through the second contact hole CH2. In some embodiments, the first and second pad electrodes 192 and 194 may be transparent electrodes.

Hereinafter, the method of manufacturing the MEMS microphone 101 will be described in detail with reference to the drawings.

Figure 3:
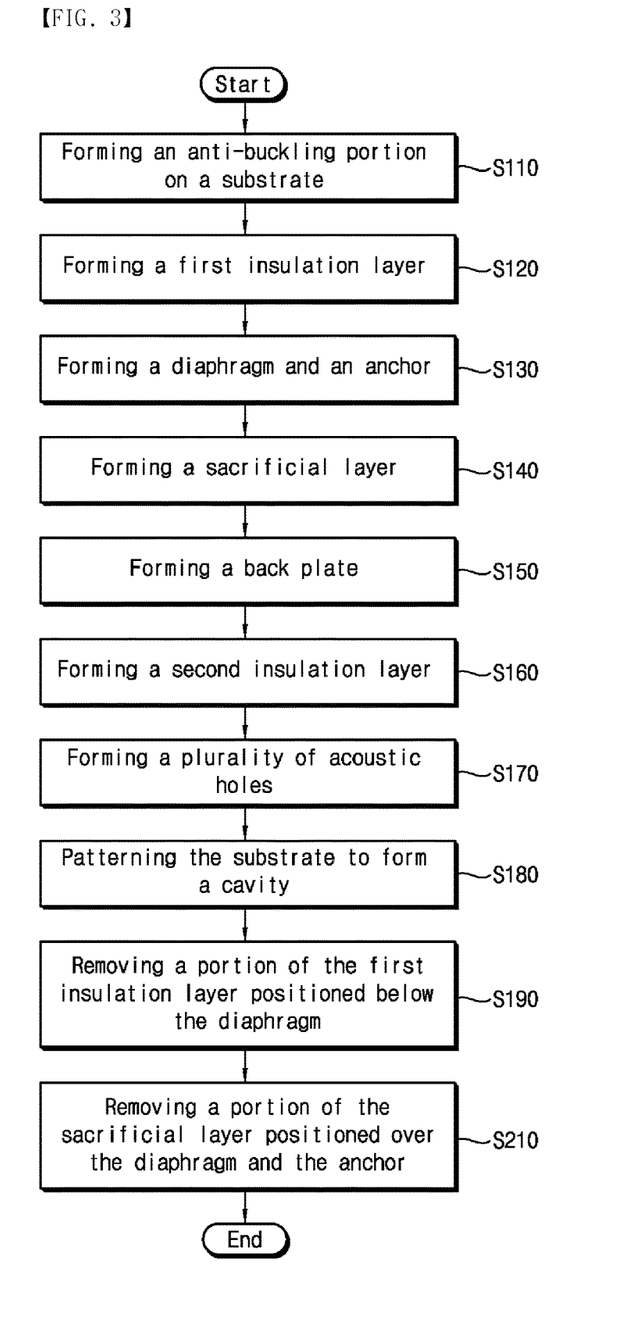
FIG. 3 is a flow chart illustrating a method of manufacturing a MEMS microphone in accordance with an example embodiment of the present invention.
Figure 4:
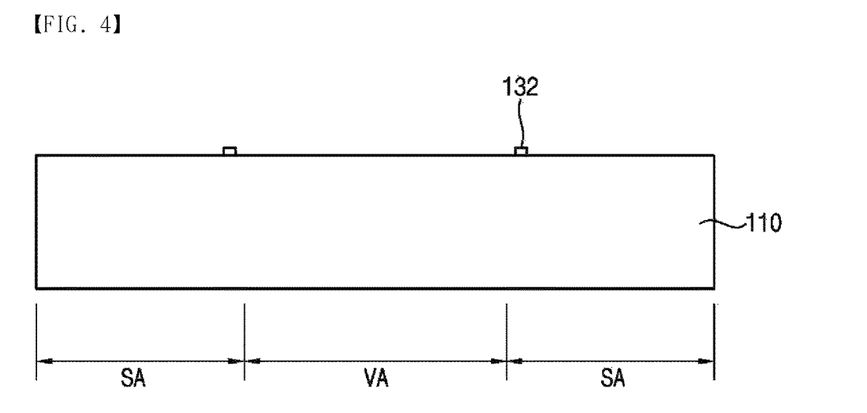
FIG. 4 is a cross sectional view illustrating a step of forming an anti-buckling portion in FIG. 3.

FIG. 3 is a flow chart illustrating a method of manufacturing a MEMS microphone in accordance with an example embodiment of the present invention. FIG. 4 is a cross sectional view illustrating a step of forming an anti-buckling portion in FIG. 3.

Figure 5:
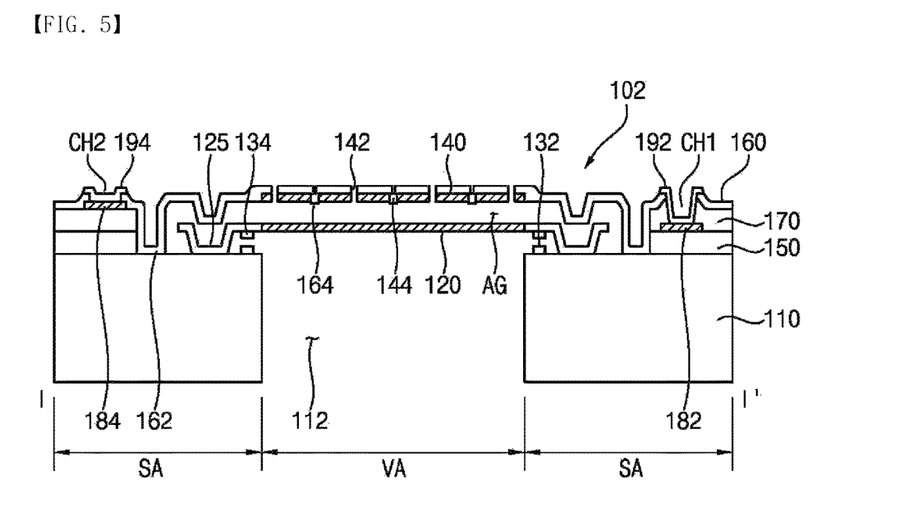
FIG. 5 is a cross sectional view illustrating a MEMS microphone in accordance with an example embodiment of the present invention.

Referring to FIGS. 1, 3 and 4, according to a method for manufacturing the MEMS microphone 101 in accordance with an example embodiment, an anti-buckling portion is formed on the upper face of a substrate 110 (step S110). As shown with respect to the embodiment in FIG. 4, first anti-buckling pad 132 can be formed in a peripheral area SA of the substrate 110, which is adjacent to a vibration area VA. There may be more than one first anti-buckling pad 132, in embodiments. For example, as shown in FIG. 4 there are two first anti-buckling pads 132. The first anti-buckling pads 132 may be formed to have a dot shape, and may be spaced apart from one another along the circumference of the vibration area VA. In embodiments, anti-buckling pads need not be placed precisely at the border of vibration area VA and peripheral area SA, but could instead be located just within peripheral area SA, as shown in FIGS. 4 and 5.

Referring again to FIGS. 2 and 3, a first insulation layer 150 is formed on the substrate 110 on which the first anti-buckling pads 132 are formed (step S120). In an example embodiment, the first anti-buckling pads 132 may be made using a silicon nitride material, and the first insulation layer 150 may be made of a silicon oxide material, among other materials.

A diaphragm 120 and anchors 125 are formed on the first insulation layer 150 (step S130). Diaphragm pad 182 may be formed in the peripheral region SA. Impurities are doped into the vibration area VA of the diaphragm 120 through an ion implantation process or another process to create an n-type or p-type material.

Figure 7:
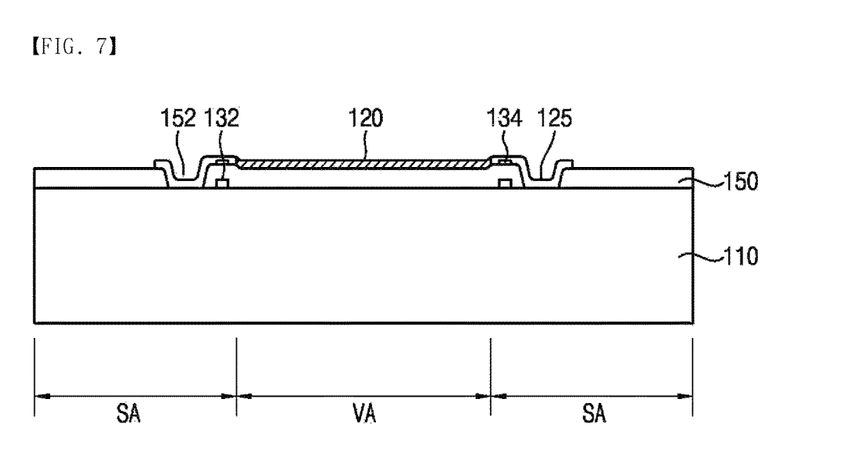

In an example embodiment, prior to performing the step S130, anchor holes 152 (see FIG. 7) for forming the anchors 125 may be formed in the peripheral region SA of the first insulation layer 150 (see FIG. 7). The diaphragm 120 and the anchors 125 may be made using a polysilicon material, in embodiments.

A sacrificial layer (not shown) can be formed on the first insulation layer 150, and upon which the diaphragm 120 is formed (step S140).

Figure 8:
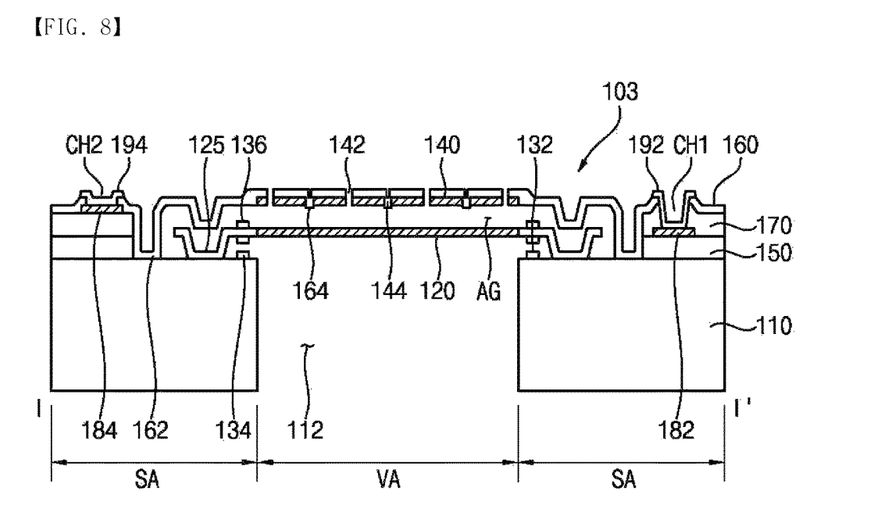
FIG. 8 is a cross sectional view illustrating a MEMS microphone in accordance with an example embodiment of the present invention.

Next, a back plate 140 having the dimple holes 144 in the vibration area VA of the sacrifice layer is formed (step S150, see also FIG. 8). A back plate pad 184 may be formed in the peripheral area SA, and the back plate 140 may be doped with impurities through ion implantation process.

A second insulation layer 160 defining a chamber portion 162 is formed on the sacrificial layer on which the back plate 140 is formed (step S160). The sacrificial layer and the first insulation layer 150 may be patterned to form a chamber hole (not shown) for forming the chamber portion 162 in the peripheral region SA before the second insulation layer 160 is formed, in embodiments.

In an example embodiment, the method of manufacturing the MEMS microphone 101 a may further include the steps of forming a second insulation layer 160, patterning the second insulation layer 160 and the sacrificial layer to form first and second contact holes CH1 and CH2, and forming first and second pad electrodes 192 and 194 on the second insulation layer 160 on which the first and second contact holes CH1 and CH2 are formed.

Subsequently, the second insulation layer 160 and the back plate 140 are patterned to form the acoustic holes 142 penetrating through the second insulation layer 160 and the back plate 140 (step S170).

The substrate 110 is patterned to form a cavity 112 in the vibration area VA (step S180).

An etchant is supplied to the first insulation layer 150 through the cavity 112 to remove a portion of the first insulation layer 150 under the diaphragm 120 such that only a portion of the second insulation layer 160 located outside the chamber portion 162 remains (step S190).

Subsequently, an air gap AG is formed by removing the diaphragm 120 and the portions located on the anchors 125 from the sacrificial layer (step S210). As a result, a MEMS microphone 101 as shown in FIG. 2 is completed.

FIG. 5 is a cross sectional view illustrating a MEMS microphone in accordance with an example embodiment of the present invention.

Referring to FIG. 5, a MEMS microphone 102 according to an embodiment of the present invention has the same configuration as the MEMS microphone 101 shown in FIGS. 1 and 2 except for the anti-buckling portion. Thus, a detailed explanation on the same elements as those of the MEMS microphone 101 shown in FIG. 1 will be omitted.

In particular, an anti-buckling portion may be formed in plural. The anti-buckling portions may include a first anti-buckling pad 132 and a second anti-buckling pad 134, respectively.

The first anti-buckling pad 132 is provided on the upper face of the substrate 110 and is located in the peripheral area SA. The first anti-buckling pad 132 may be substantially identical to the first anti-buckling pad 132 shown in FIGS. 1 and 2, so that a detailed description thereof will be omitted.

The second anti-buckling pad 134 is provided to correspond to the first anti-buckling pad 132. The second anti-buckling pad 134 may be located on the upper side of the first anti-buckling pad 132 and may be provided on the lower face of the diaphragm 120.

In an example embodiment of the present invention, the second anti-buckling pad 134 is spaced apart from the first anti-buckling pad 132 not to affect the banding action of the diaphragm 120 due to an acoustic pressure. Thus, the diaphragm 120 can be freely bent upwardly and downwardly according to the acoustic pressure. The second anti-buckling pad 134 may be made of a silicon nitride material, and the thickness of the second anti-buckling pad 134 may be determined considering a flat degree or a warpage of the diaphragm 120.

Thus, the MEMS microphone 102 is provided with the first and second anti-buckling pads 132 and 134 under the diaphragm 120 to prevent the diaphragm 120 from falling by an amount of more than a predetermined level. Accordingly, since the diaphragm 120 can have a tensile stress, a buckling phenomenon of the diaphragm 120 due to a compressive stress can be prevented.

Hereinafter, a manufacturing process of the MEMS microphone 102 according to an example embodiment of the present invention will be described with reference to the drawings.

Figure 6:
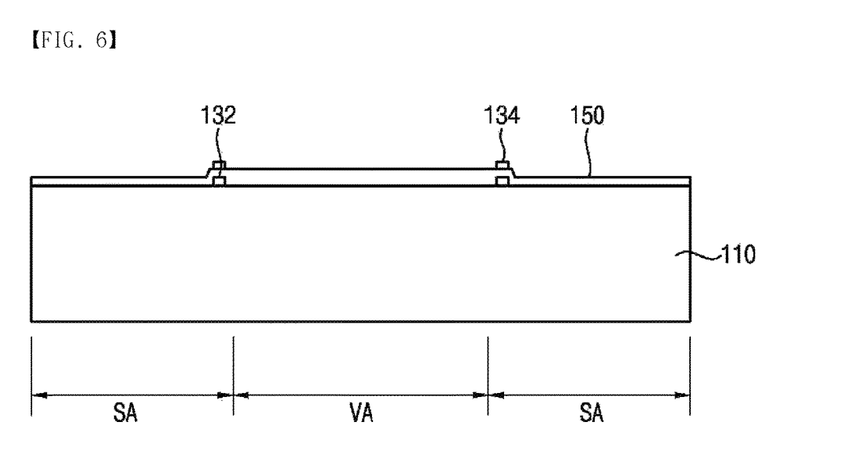
FIGS. 6 and 7 are cross sectional views illustrating a step of forming an anti-buckling portion included a MEMS microphone in FIG. 5.

FIGS. 6 and 7 are cross sectional views illustrating a step of forming an anti-buckling portion included a MEMS microphone in FIG. 5.

Referring to FIGS. 5 to 7, according to a method of manufacturing the MEMS microphone, first anti-buckling pads 132 are formed in a peripheral region SA of a substrate 110. As shown in FIG. 6, a first insulation layer 150 is formed on the substrate 110, and then, second anti-buckling pads 134 are formed on the first insulation layer 150 to form the anti-buckling portions including the first and the second anti-buckling pads 132 and 134, which are positioned under a diaphragm 120. The second anti-buckling pads 134 are positioned over the first anti-buckling pads 132. Then, a portion of the first insulation layer 150, which is located between the first anti-buckling pads 132 and the second anti-buckling pads 134 are removed as well while removing a portion of the first insulation layer 150 positioned under the diaphragm 120. Accordingly, the first anti-buckling pad 132 and the second anti-buckling pad 134 may be spaced apart from one another.

The diaphragm 120 and anchors 125 are formed on the first insulation layer 150 on which the second anti-buckling pads 134 and the second anti-buckling pads 134 are formed. The subsequent steps are the same as the method of manufacturing the MEMS microphone 101 illustrated with reference to FIG. 3, so a detailed description thereof will be omitted.

FIG. 8 is a cross sectional view illustrating a MEMS microphone in accordance with an example embodiment of the present invention.

Referring to FIG. 8, a MEMS microphone 103 according to an example embodiment of the present invention has the same configuration as those of the MEMS microphone 102 illustrated with reference to FIG. 5 except for the anti-buckling portion. Thus, the same elements as those of the MEMS microphone 102 will not be described again.

In particular, each of the anti-buckling portions may include a first anti-buckling pad 132, a second anti-buckling pad 134, and a third anti-buckling pad 136.

The first anti-buckling pad 132 is provided on an upper face of a substrate 110 and is located in a peripheral area SA. The first anti-buckling pad 132 is the same as the first anti-buckling pad 132 shown in FIGS. 1 and 2, so that a detailed description thereof will be omitted.

The second anti-buckling pad 134 is provided to correspond to the first anti-buckling pad 132 along a vertical direction. The second anti-buckling pad 134 may be located over the first anti-buckling pad 132 and may be provided on the lower face of the diaphragm 120. Since the second anti-buckling pad 134 is the same as the second anti-buckling pad 134 shown in FIG. 5, a detailed description thereof will be omitted.

The third anti-buckling pad 136 is provided to correspond to the first anti-buckling pad 132 along a vertical direction. The third anti-buckling pad 136 may be disposed on the upper face of the diaphragm 120 and over the second anti-buckling pad 134. The third anti-buckling pad 136 is spaced apart from the second insulation layer 160 so as not to affect the diaphragm 120 to bend in accordance with an acoustic pressure.

In an example embodiment of the present invention, the third anti-buckling pad 136 may be made using a silicon nitride material or similar, and the third anti-buckling pad 136 may have a thickness adjustable considering a flat degree or a warpage degree of the diaphragm.

Accordingly, the MEMS microphone 103 includes the anti-buckling pads 132, 134, and 136 which the diaphragm 120 is interposed between, so that buckling of the diaphragm 120 may be efficiently prevented. In addition, since the third anti-buckling pad 136 is provided on the upper face of the diaphragm 120, the diaphragm 120 can easily return to an initial position. Therefore, since the diaphragm 120 can have a tensile stress, a buckling of the diaphragm 120 due to compressive stress can be prevented.

Hereinafter, a manufacturing process of the MEMS microphone in FIG. 8 according to an example embodiment of the present invention will be described with reference to the drawings.

Figure 9:
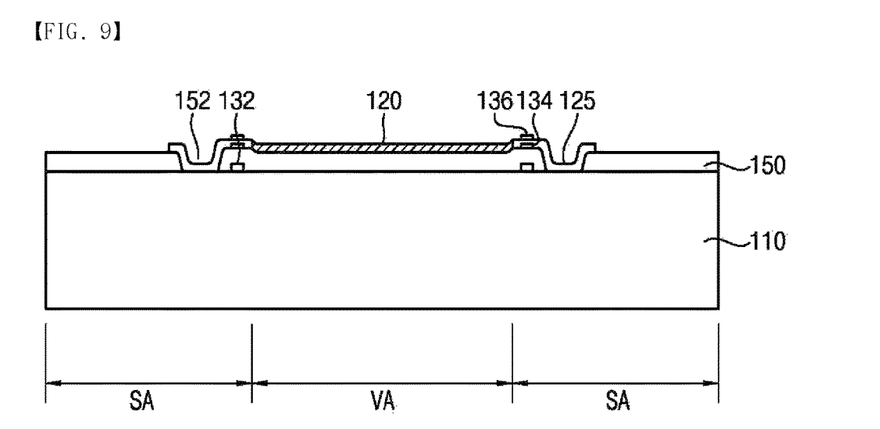
FIG. 9 is a cross sectional view illustrating a step of forming an anti-buckling portion included a MEMS microphone in FIG. 8.

FIG. 9 is a cross sectional view illustrating a step of forming an anti-buckling portion included a MEMS microphone in FIG. 8.

Referring to FIGS. 8 and 9, according to a method of manufacturing the MEMS microphone 102, first anti-buckling pads 132 are formed in the peripheral region SA of the substrate 110.

After a first insulation layer 150 is formed on a substrate 110, second anti-buckling pads 134 are formed on the first insulation layer 150, as shown in FIG. 6. Second anti-buckling pads 134 are formed on the first anti-buckling pads 132 to form forming an anti-buckling portion located under the diaphragm 120. The second anti-buckling pads 134 are disposed over the first anti-buckling pads 132.

A portion of the first insulation layer 150 located between the first anti-buckling pads 132 and the second anti-buckling pads 134 is then removed while removing the first insulation layer 150. Accordingly, the first anti-buckling pad 132 and the second anti-buckling pad 134 may be spaced apart from one another.

After forming the second anti-buckling pads 134, the first insulation layer 150 is patterned to form a plurality of anchor holes 152 for forming the anchors 125, as shown in FIG. 9.

The diaphragm 120 and the anchors 125 are formed on the first insulation layer 150, and then third anti-buckling pads 136 are formed on an upper face of the diaphragm 120.

A sacrificial layer (not shown) is formed on the substrate 110 on which the third anti-buckling pads 136 are formed, and the subsequent steps of forming the third anti- Is the same as the method of manufacturing the MEMS microphone 101 shown in FIG. 3. Thus, a detailed description thereof will be omitted.

Although the semiconductor gas sensors have been described with reference to the specific embodiments, they are not limited thereto. Therefore, it will be readily understood by those skilled in the art that various modifications and changes can be made thereto without departing from the spirit and scope of the appended claims.

Various embodiments of systems, devices, and methods have been described herein. These embodiments are given only by way of example and are not intended to limit the scope of the claimed inventions. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the claimed inventions.

Persons of ordinary skill in the relevant arts will recognize that the subject matter hereof may comprise fewer features than illustrated in any individual embodiment described above. The embodiments described herein are not meant to be an exhaustive presentation of the ways in which the various features of the subject matter hereof may be combined. Accordingly, the embodiments are not mutually exclusive combinations of features; rather, the various embodiments can comprise a combination of different individual features selected from different individual embodiments, as understood by persons of ordinary skill in the art. Moreover, elements described with respect to one embodiment can be implemented in other embodiments even when not described in such embodiments unless otherwise noted.

Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims, it is expressly intended that the provisions of 35 U.S.C. § 112(f) are not to be invoked unless the specific terms "means for" or "step for" are recited in a claim.

What is claimed is:

1. A MEMS microphone comprising:
a substrate defining a cavity;
a back plate disposed over the substrate and defining a plurality of acoustic holes;
a diaphragm disposed between the substrate and the back plate, the diaphragm being spaced apart from the substrate and from the back plate and covering the cavity, the diaphragm configured to sense an acoustic pressure to create a corresponding displacement; and
at least one anti-buckling portion provided between the substrate and the diaphragm to temporarily support the diaphragm during displacement of the diaphragm and to prevent a buckling of the diaphragm from occurring,
wherein the anti-buckling portion includes a first anti-buckling pad formed on an upper face of the substrate, and the first anti-buckling pad is spaced apart from a lower face of the diaphragm.

2. The MEMS microphone of claim 1, further comprising:
an anchor provided at an end portion of the diaphragm and connected to the substrate to support the diaphragm,
wherein the anchor is located radially outward from the cavity, and the anti-buckling portion is located between the anchor and the cavity in the radial direction.

3. The MEMS microphone of claim 1, wherein the anti-buckling portion includes a plurality of anti-buckling pads configured to come into contact with one another only during deformation of the diaphragm.

4. The MEMS microphone of claim 3, wherein the anti-buckling pads further comprise
a second anti-buckling pad disposed on a lower face of the diaphragm.

5. The MEMS microphone of claim 4, wherein the first and the second anti-buckling pads are spaced apart from each other when the diaphragm is not deformed.

6. The MEMS microphone of claim 4, wherein the anti-buckling pads further include a third anti-buckling pad disposed on an upper face of the diaphragm.

7. The MEMS microphone of claim 1, wherein the at least one anti-buckling portion comprises a plurality of anti-buckling portions spaced apart from one another along a circumference of the cavity.

8. The MEMS microphone of claim 1, wherein the at least one anti-buckling portion has a cylindrical shape.

9. The MEMS microphone of claim 1, wherein the at least one anti-buckling portion is disposed adjacent to the cavity.

10. The MEMS microphone of claim 1, wherein the at least one anti-buckling portion comprises silicon nitride.

11. The MEMS microphone of claim 1, wherein the anti-buckling portion has a thickness adjustable in accordance with a warpage degree of the diaphragm.

12. A MEMS microphone comprising:
- a substrate defining a cavity, the substrate being divided into a vibration area and a peripheral area surrounding the vibration area;
- a diaphragm disposed over the substrate to cover the cavity, the diaphragm being spaced apart from the substrate, and configured to sense an acoustic pressure to create a displacement;
- a back plate disposed over the diaphragm, the back plate being spaced apart from the diaphragm to face the diaphragm and having a plurality of acoustic holes; and
- a plurality of anti-buckling pads between which the diaphragm is located, at least some of the plurality of anti-buckling pads configured to face one another, and the anti-buckling pads being disposed in the peripheral area and being configured to prevent a buckling of the diaphragm.

13. The MEMS microphone of claim 12, further comprising:
- an anchor disposed in the peripheral area to be connected to the diaphragm, the anchor connecting the diaphragm to the substrate,
- wherein the anti-buckling portion is located closer to the cavity han the anchor.

14. The MEMS microphone of claim 12, wherein the at least one anti-buckling portion comprises a plurality of anti-buckling portions, and each of the plurality of anti-buckling portions are spaced apart from one another along a circumference of the cavity to surround the vibration area.

15. The MEMS microphone of claim 12, wherein the at least one anti-buckling pads comprise:
- a first anti-buckling pad formed on an upper face of the substrate;
- a second anti-buckling pad disposed over the first anti-buckling pad and on an lower face of the diaphragm; and
- a third anti-buckling pad disposed on an upper face of the diaphragm.

16. A method of manufacturing a MEMS microphone comprising:
- forming an anti-buckling portion in a peripheral region of a substrate, the substrate being divided into a vibration area and the peripheral area surrounding the vibration area;
- forming an insulation layer on the substrate on which the anti-buckling portion is formed;
- forming a diaphragm and an anchor on the insulation layer, the anchor being connected to the diaphragm to support the diaphragm and being formed in the peripheral area, and the diaphragm being prevented from warping owing to the anti-buckling portion;
- forming a sacrificial layer on the insulation layer on which the diaphragm is formed;
- forming a back plate on the sacrificial layer and in the vibration area to face the diaphragm;
- patterning the substrate to form a cavity in the vibration area to expose the insulation layer;
- etching a portion of the insulation layer under the diaphragm using the cavity as an etch mask; and
- removing a portion of the sacrificial layer corresponding to the diaphragm and the anchor.

17. The method of claim 16, wherein forming the anti-buckling portion includes forming a plurality of anti-buckling pads having a vertically-stacked structure.

18. The method of claim 17, wherein forming the anti-buckling portion comprises:
- forming a first anti-buckling pad on an upper face of the substrate; and
- prior to forming the diaphragm, forming a second anti-buckling pad on an upper face of the insulation layer opposite of the first anti-buckling pad.

19. The method of claim 18, wherein forming the anti-buckling portion further comprises forming a third anti-buckling pad on an upper face of the diaphragm to correspond to the second anti-buckling pad, after forming the diaphragm.

20. The method of claim 16, wherein the anti-buckling portion comprises a plurality of anti-buckling portions that are spaced apart from one another along a circumference of the vibration area.

* * * * *